(12) United States Patent
Nguyen et al.

(10) Patent No.: US 8,461,885 B2
(45) Date of Patent: Jun. 11, 2013

(54) HYBRID DIGITAL-ANALOG PHASE LOCKED LOOPS

(75) Inventors: Khiem Quang Nguyen, Tewksbury, MA (US); Jie Fu, Shanghai (CN); Xiaoting Zhu, Shanghai (CN)

(73) Assignee: Analog Devices, Inc., Norwood, MA (US)

(*) Notice: Subject to any disclaimer, the term of this patent is extended or adjusted under 35 U.S.C. 154(b) by 188 days.

(21) Appl. No.: 13/155,561

(22) Filed: Jun. 8, 2011

(65) Prior Publication Data
US 2012/0313676 A1   Dec. 13, 2012

(51) Int. Cl.
*H03L 7/06* (2006.01)
(52) U.S. Cl.
USPC ............................. 327/156; 327/147
(58) Field of Classification Search
USPC .................................. 327/147, 156
See application file for complete search history.

(56) References Cited

U.S. PATENT DOCUMENTS

| | | | | |
|---|---|---|---|---|
| 2011/0133799 A1* | 6/2011 | Dunworth et al. | ............ | 327/157 |
| 2011/0140747 A1* | 6/2011 | Endo et al. | ............ | 327/156 |
| 2011/0221487 A1* | 9/2011 | Lesso | ............ | 327/147 |
| 2012/0100821 A1* | 4/2012 | Dan et al. | ............ | 455/269 |
| 2012/0242386 A1* | 9/2012 | Nakamuta et al. | ............ | 327/159 |
| 2012/0313676 A1* | 12/2012 | Nguyen et al. | ............ | 327/156 |

* cited by examiner

*Primary Examiner* — Adam Houston
(74) *Attorney, Agent, or Firm* — Kenyon & Kenyon LLP (57) ABSTRACT

A digital PLL may be combined with an analog PLL so that the output of the digital PLL is at a frequency high enough to maintain stability in the analog PLL when an initial reference clock signal is too low to maintain stability in the analog PLL. The digital PLL may include a scaling circuit, such as a frequency divider in the feedback path of the PLL, to generate the higher frequency output signal from the lower frequency reference input signal. The digital PLL may also use an on-chip free run ring oscillator as the clock for the digital PLL engine.

28 Claims, 5 Drawing Sheets

HYBRID DIGITAL-ANALOG PHASE LOCKED LOOPS

BACKGROUND

Phase locked loops (PLLs) are electronic circuits that have been used to generate output signals having a phase related to that of a reference input signal. PLLs have typically included a phase detector, a low pass filter, a variable frequency oscillator, and a feedback path. In traditional analog PLLs, the phase detector is an analog multiplier and the oscillator is a voltage controlled oscillator.

One of the limitations of traditional analog PLLs is that the input frequency must typically be at least higher than the bandwidth of the PLL. Typically, the input frequency must be at least five times higher than the bandwidth of the PLL in order to maintain output signal stability. As the reference frequency becomes smaller, the PLL bandwidth narrows to satisfy the stability criteria. The resistor and capacitor values of the low pass filter are then increased to accommodate the narrower PLL bandwidth. Smaller reference frequencies therefore require larger resistors and capacitors, which may not be practical to integrate. These limitations limit the use of analog PLLs in applications having a slow input reference clock frequency and a lack of space for larger external resistors or capacitors. These applications may include low power portable devices, such as battery operated mobile computing devices, smart phones, and electronics.

In general, an analog PLL is stable when the normalized loop gain (K) multiplied by the time constant of the loop filter zero ($\tau_z$) is less than the following function of the angular frequency $f(\omega_{in})$:

$$K\tau_2 < \frac{1}{\frac{\pi}{\omega_{in}\tau_z}\left(1+\frac{\pi}{\omega_{in}\tau_z}\right)}$$

To get around this stability restriction, manufacturers have included additional external passive signal conditioning elements, such as, for example, resistors and capacitors, to realize a narrow loop bandwidth in order for the PLL to lock to a low input frequency reference signal. Adding these additional external resistors and capacitors may increase the time constant $\tau_z$ since in some embodiments, $\tau_z=R_zC_c$ while $K=I_{cp}K_{osc}R_z/2\pi N$, though in other embodiments, other functions may be used to calculate the time constant and/or normalized loop gain. However, these additional elements require additional space and have an added cost associated with a higher integrated circuit pin count. As portable computing and electronic devices get smaller, it is increasingly desirable to minimize circuit size and eliminate external elements.

Thus, there is a need for an analog PLL circuit that is able to process slower reference frequency input signals without the need for additional external signal conditioning elements, such as resistors and capacitors.

DETAILED DESCRIPTION

In an embodiment of the invention, a digital PLL may be combined with an analog PLL so that the output of the digital PLL is at a frequency high enough to maintain stability in the analog PLL when the reference clock signal is too low to maintain stability. The digital PLL may include a scaling circuit, such as a frequency divider in the feedback path of the PLL, to generate the higher frequency output signal from the lower frequency reference input signal. The digital PLL may also use an on-chip free run oscillator as the clock for the numerical controlled oscillator (NCO). Each of the components in the digital PLL may be realized using digital gates and registers. The operation and stability criteria of a digital PLL in an embodiment may be similar to those of an analog PLL. To satisfy stability criteria in a digital PLL, the narrow bandwidth low pass filter may include digital gates and registers. This also enables the digital PLL to be easily integrated in a variety of devices. In an embodiment, a digital PLL may be designed to lock to a reference input frequency.

This locking process may be expedited by combining a counter and a gain as part of a multiplier within the digital PLL to increase the loop bandwidth of the digital PLL during the locking process. The combination counter and gain circuit enables the output of the counter to be scaled, thereby increasing the bandwidth of the digital PLL. When the digital PLL is close to locking onto the reference input frequency, the gain may be bypassed or otherwise reduced to lower the bandwidth of the digital PLL.

The digital circuits in the digital PLL may be configured to create a narrow loop bandwidth sufficient to create a high frequency output without the need for additional external signal conditioning elements, such as resistors and capacitors. While the high frequency output from the digital PLL may also include a high frequency jitter due, in part, to the use of digital circuits, the high frequency jitter may be filtered out at the analog PLL that is coupled to the digital PLL. The analog PLL may be configured to include a loop bandwidth high enough to filter out the jitter and obviate the need for larger signal conditioning elements, such as resistors and/or capacitors.

Figure 1:
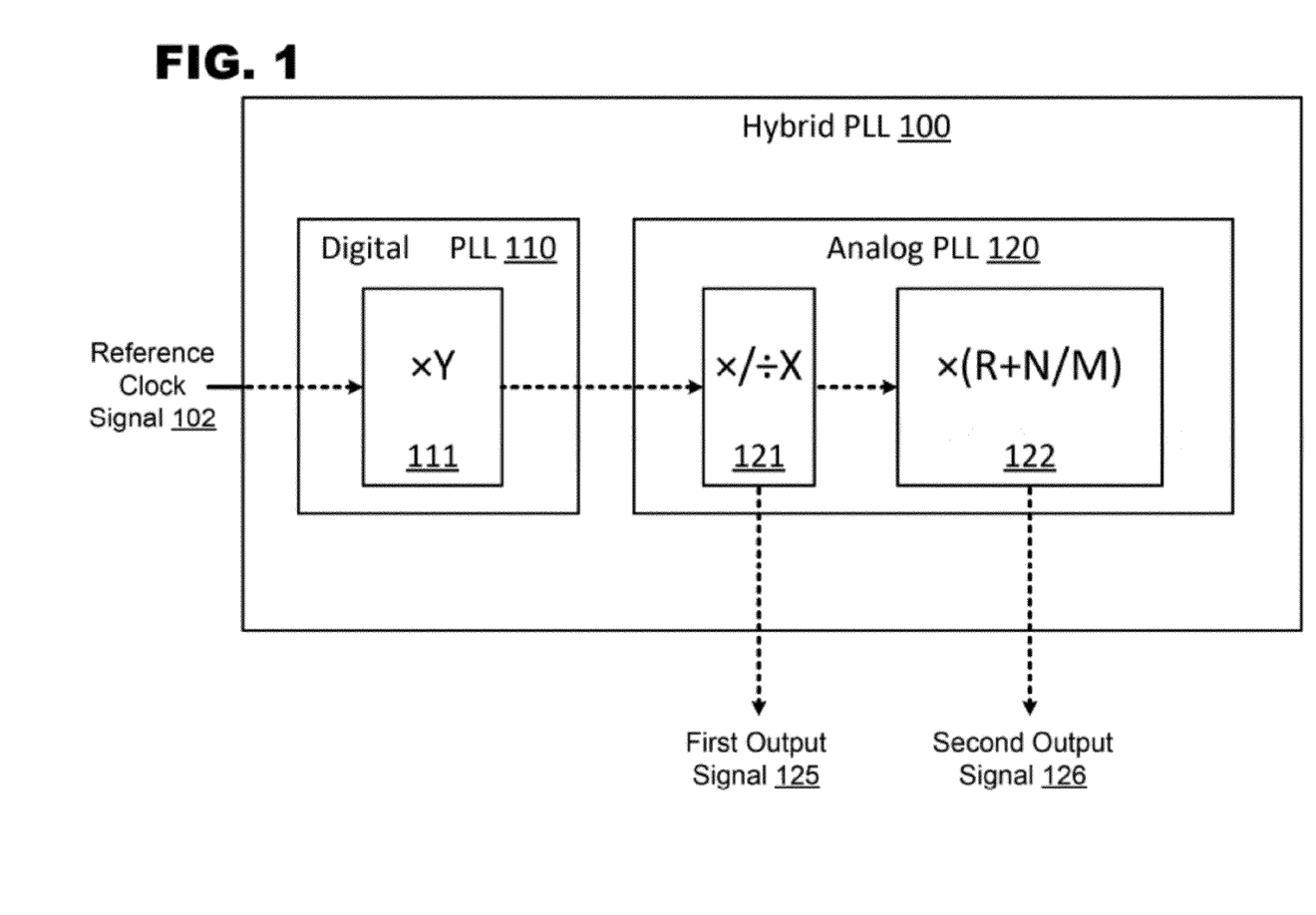
FIG. 1 shows a combined digital PLL and analog PLL in an embodiment of the invention.

FIG. 1 shows an exemplary configuration of a hybrid digital-analog PLL 100 in an embodiment. The hybrid PLL 100 may include a digital PLL 110 coupled to an analog PLL 120. The digital PLL 210 may include a scaling circuit 111 to multiply the reference clock signal frequency 102. The digital PLL 210 may use a numerically controlled oscillator as its oscillator. In an embodiment, the scaling circuit 111 may multiply the word clock signal frequency by an integer factor of Y, which may also be a power of 2 in an embodiment. In an embodiment, "Y" may be programmable and may vary depending on the application. In other embodiments, other multipliers and multiplication factors may be used.

Once the frequency of the reference clock signal 102 has been scaled, the higher frequency may be sent to a coupled analog PLL 120. The analog PLL may include a frequency multiplier and/or divider 121, and/or a fractional-n synthesizer 122. The parameters of these frequency dividers, multipliers, and/or fractional-n synthesizers may be programmable to accommodate different desired scaled output frequencies. For example, the multiplier/divisor "X" of the frequency multiplier/divider 121, and the parameters R, M, N, resulting in an average frequency multiplier of (R+N/M) for the fractional-n synthesizer 122, may be programmable.

The frequency dividers, multipliers, and/or fractional-n synthesizers may generate one or more scaled frequencies depending on the particular application. For example, as shown in FIG. 1, a frequency divider 121 may scale the multiplied word clock signal from the digital PLL 110 to generate a first output signal 125. The first output signal 125 may then be outputted, as, for example, a scaled clock signal. The first output signal 125 and/or the output signal from the digital PLL 110 may also be inputted to a fractional-n synthesizer 122, which may generate additional output signals 126 different from the first scaled signal 125. The additional scaled signal 126, may, for example, correspond to an alternative scaled clock signal for other processing functions.

Figure 2:
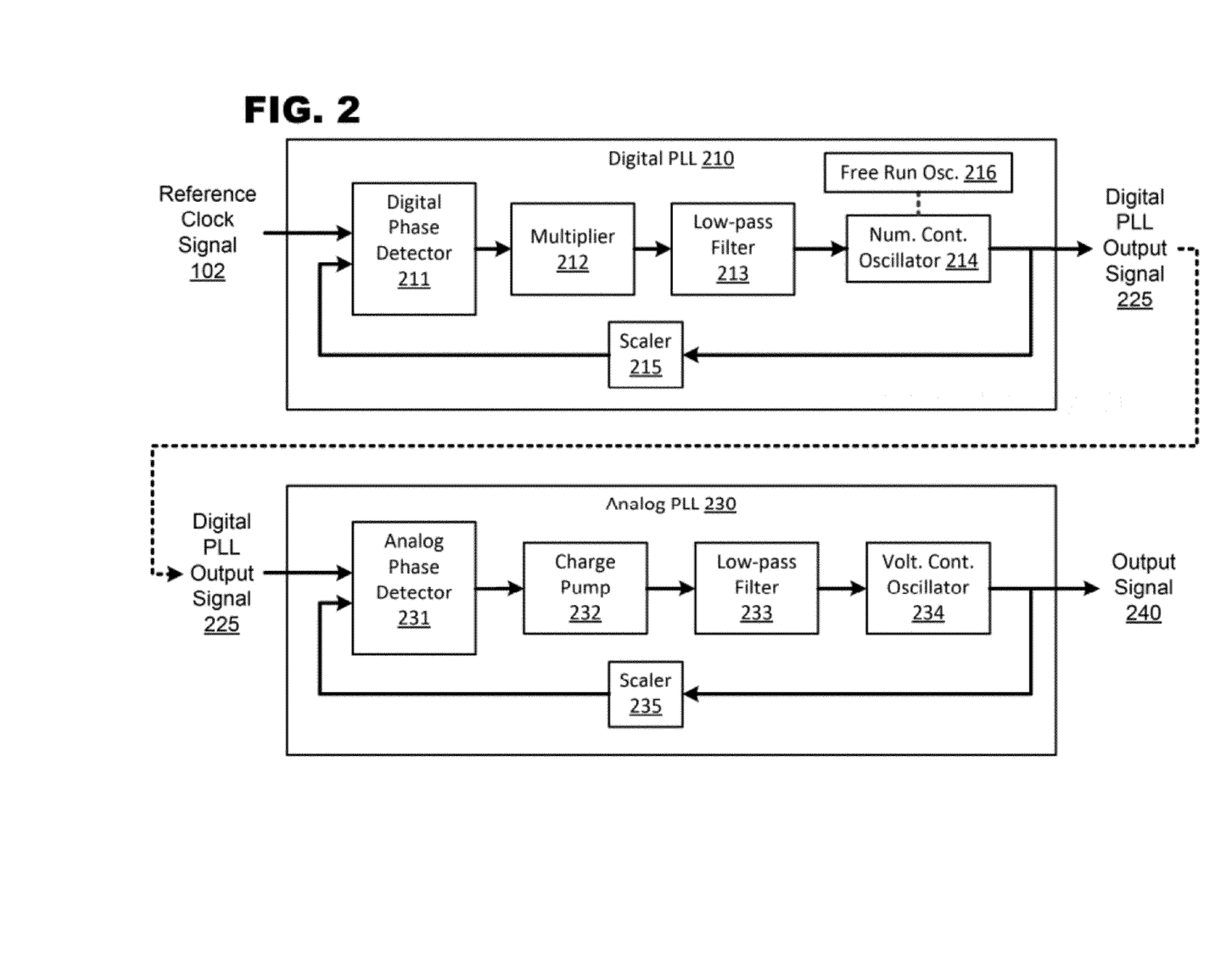
FIG. 2 shows an exemplary configuration of a digital PLL and an analog PLL in an embodiment.

FIG. 2 shows an exemplary configuration of a digital PLL 210 and an analog PLL 230 in an embodiment. A digital PLL may include a digital phase detector 211 to compare and detect a phase difference between a reference clock signal 102 and a feedback signal from the output of a numerically controlled oscillator 214 after passing through a scaler 215, which may include a frequency divider. Although the scaler 215 is shown as included in the feedback path, the scaler may be included in the primary path, such as through a coupling to the output of the numerically controlled oscillator 214. The output of the digital phase detector 211 may then be scaled or multiplied through a multiplier 212.

The multiplier 212 may include a counter and gain circuits to increase the bandwidth when the digital PLL is attempting lock on to a reference frequency or during periods of increased oscillations resulting from signal level changes. The bandwidth may be reduced once the digital PLL is close to acquiring a lock on the reference signal or the oscillations resulting from signal level changes, such as voltage changes, have subsided. The scaled output signal may then be filtered through low-pass filter 213 and used to control a numerically controlled oscillator 214. The numerically controlled oscillator 214 may be clocked from a free running oscillator 216, such as a free running ring oscillator. The numerically controlled oscillator 214 may also be configured to operate in a manner similar to a voltage controlled oscillator in an analog PLL.

The free running ring oscillator may include a odd number of NOT gates coupled together in a chain, with the output of the last NOT gate coupled to the input of the first NOT gates. Other free running oscillators may be used in other embodiments.

The output signal 225 from the numerically controlled oscillator 214, which may be a scaled variation of the reference clock signal 102 based on the scaling factor in the scaler 215, may then be used as an input to the analog PLL 230. In an embodiment, the scaling factor of the scaler 215 may be selected so that the output of the numerically controlled oscillator 214 is at a high enough frequency to provide stability in the analog PLL 230.

The frequency of the numerically controlled oscillator 214 may also be selected so that jitter caused by clock edge uncertainty and noise from the multiplier 212 is upconverted to a high enough frequency to be filtered at the filter 233 of the analog PLL 230.

In an embodiment, the reference clock signal 102 may be about or between 32 kHz and 48 kHz. The scaler 215 may increase the frequency of the reference clock signal 102 by a factor of 256 or 384. The free run oscillator may oscillate about or between 25 MHz and 60 MHz and/or at a nominal frequency of 37.5 MHz. The output of the digital PLL may be about or between 11 MHz and 12 MHz. Finally, the output of the analog PLL may be about or between 45 MHz and 49 MHz. In other embodiments, the aforementioned frequencies and scaling factors may vary from those mentioned depending on the particular application.

The output signal 225 from the numerically controlled oscillator 214 may then be coupled to an analog phase detector 231 input of the analog PLL 230. A second input of the analog phase detector 231 may be coupled to a scaled output of a voltage controlled oscillator 234. The output of the voltage controlled oscillator 234 may be scaled through a scaling circuit 235, which may include any type of scaling circuitry, such as a frequency divider, frequency multiplier, and/or fractional-n synthesizer, depending on the application.

The analog phase detector 231 may generate a voltage signal proportional to a phase difference between the output signal 225 from the digital PLL 210 and scaled signal 235 from the voltage controlled oscillator 234 output. The output of the analog phase detector 231 may be coupled to a charge pump 232 input. The charge pump 232 may generate a power signal of a desired voltage, which may be application specific. The generated power signal may then be filtered through low-pass filter 233 to remove the higher frequency noise jitter from the multiplier 212, charge pump 232, phase detectors 211 and 231, and other PLL components.

The filtered signal may then be coupled to the voltage controlled oscillator 234. The oscillation frequency of the voltage controlled oscillator 234 may be controlled by the filtered signal outputted from filter 233. The voltage controlled oscillator 234 may then output a reference signal 240 that has a higher frequency than the original reference clock signal 102.

Figure 3:
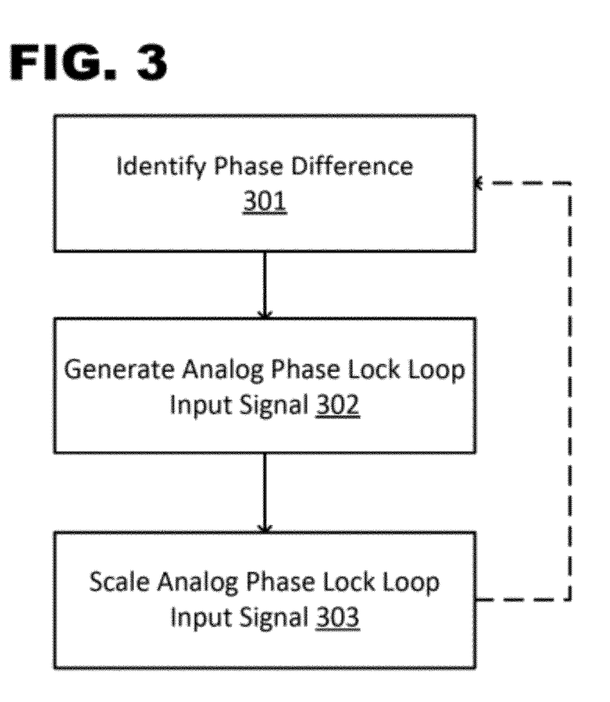
FIG. 3 shows an exemplary process for generating an analog PLL input signal from a lower frequency reference signal.

FIG. 3 shows an exemplary process for generating an analog PLL input signal from a lower frequency reference signal. In box 301, the phases of a reference signal and a scaled variation of the reference signal may be compared and a phase difference between the signals may be identified. This phase difference may be identified in some embodiments through a digital phase detector. The reference signal may have a frequency that is not high enough to maintain analog phase locked loop stability, because, for example, the frequency may be less than the bandwidth of the analog phase locked loop.

In box 302, an analog phase locked loop input signal may be generated based on the phase difference identified in box 301. This analog PLL input signal may be generated at a numerically controlled oscillator, based on the phase difference identified in box 301. The numerically controlled oscillator may adjust the frequency of the generated analog PLL input signal according to the identified phase difference to reduce the phase difference.

In box 303, the generated analog PLL signal may be scaled to generate a scaled variation of the reference signal. This scaled variation of the reference signal may then be compared to the reference signal in box 301 to identify a phase difference between the scaled signal and the reference signal. The scaled variation of the reference signal may also cause the free run oscillator to generate the higher frequency analog PLL input signal if, for example, a frequency divider or similar circuit, is used to scale the generated analog PLL signal. Scaling circuit and/or scaling factors may be selected to ensure that the analog PLL input signal has a frequency high enough to maintain analog PLL stability.

The method shown in FIG. 3 may, in some embodiments, be executed in a digital PLL coupled to an analog PLL, with the generated analog PLL input signal being supplied to the analog PLL through the coupling. Both the digital PLL and analog PLL may be included as part of a single consolidated circuit.

Figure 4:
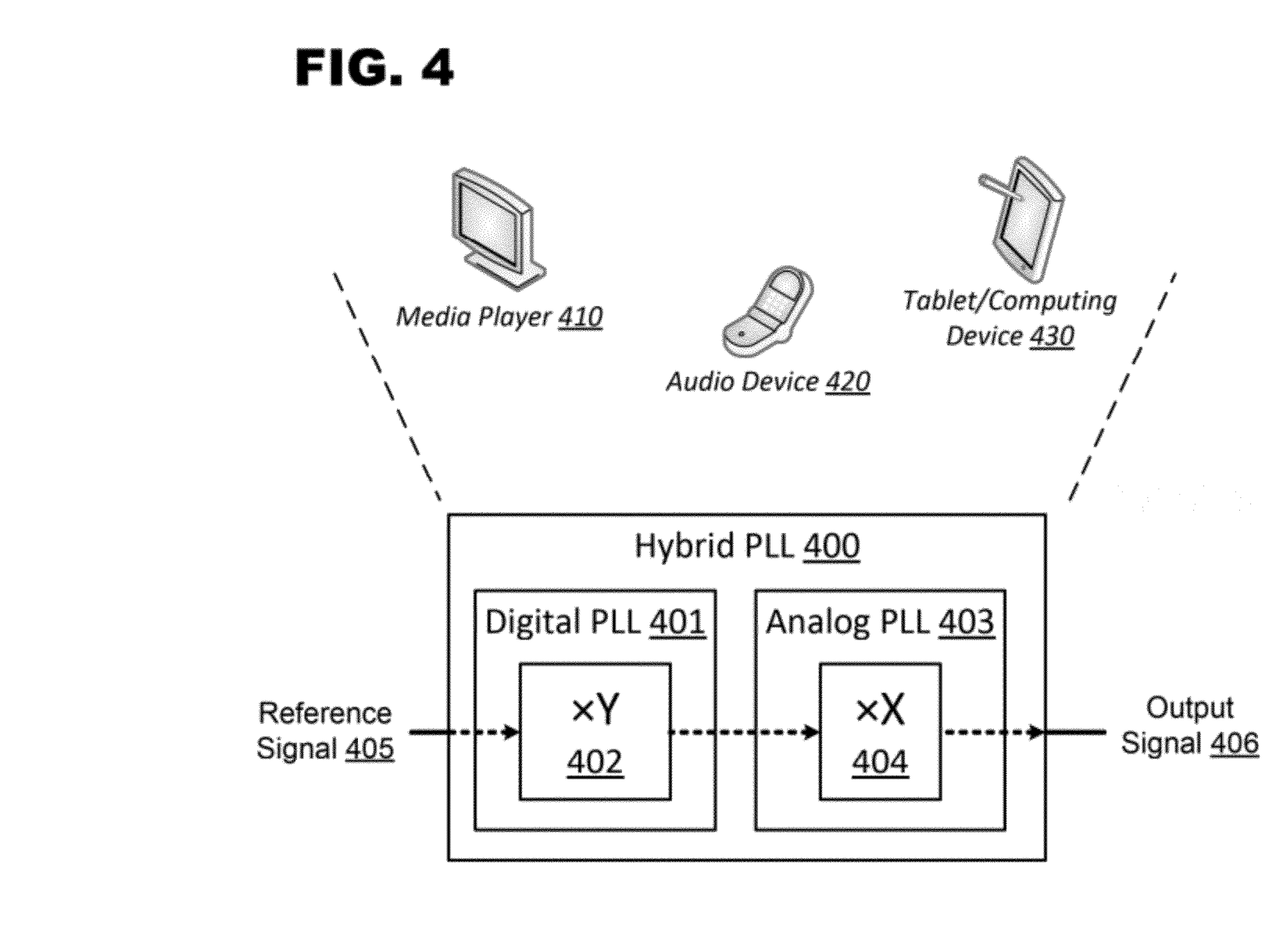
FIG. 4 shows a plurality of exemplary low-power devices embedding embodiments of the invention to raise lower frequency reference signals used to conserve device power.

FIG. 4 shows a plurality of exemplary low-power devices embedding embodiments of the invention to raise lower frequency crystal oscillator (or equivalent) reference signals used to conserve device power. These low-power devices include, but are not limited to, battery-operated media players 410, portable audio devices 420, and tablets/computing device 430. Each of these devices may include embodiments of the hybrid PLL 400 to generate a higher frequency output signal 406 from a reference signal 405 having a frequency less than that required to maintain stability in the analog PLL 403. The hybrid PLL 400 may include a digital PLL 401 coupled to an analog PLL 403. The digital PLL 401 may raise the frequency of the reference signal 405 by a factor Y 402 so that an output signal of the digital PLL 401 is at least high enough to maintain stability in the analog PLL 403. The output of the digital PLL 401 may then be inputted to the analog PLL 403, which may generate an output signal 406 that may be further raised by a factor X 404.

Figure 5:
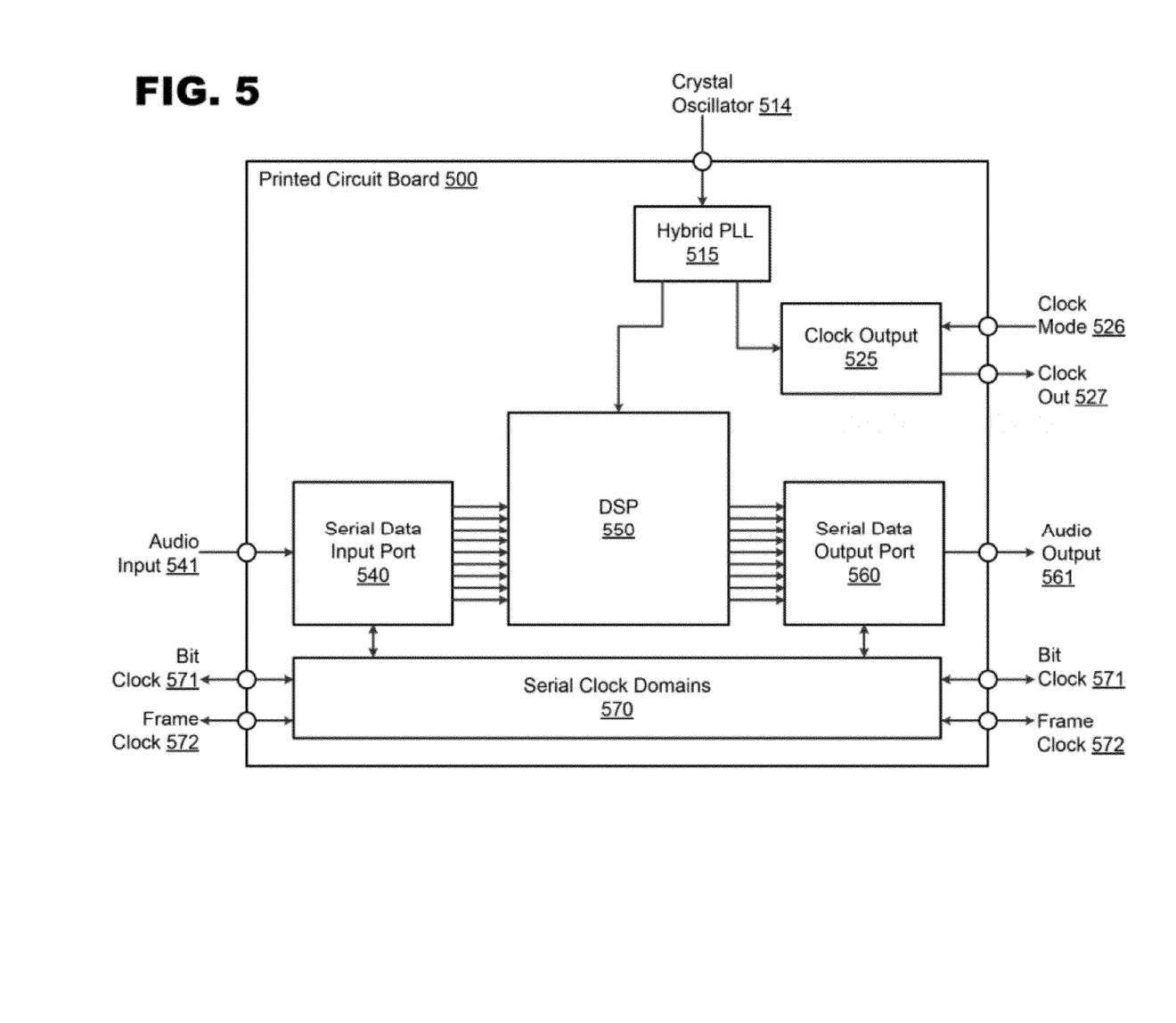
FIG. 5 shows an exemplary configuration of an audio processing device on a printed circuit board in an embodiment of the invention.

FIG. 5 shows an exemplary configuration of an audio processing device on a printed circuit board 500 in an embodiment of the invention. The printed circuit board 500 may include a hybrid PLL integrated circuit 515, a clock output circuit 525, a serial data input port 540, a digital audio signal processor 550, a serial data output port 560, and one or more serial clock domains 570. The serial data input port 540 may split and/or route a multi-channel audio input signal 541 from an audio input port of the printed circuit board 500 into a plurality of different channels sent to the digital signal processor 550 for further audio signal processing. Once the digital signal processor 550 completes its processing, the processed signals may be sent to a serial data output port 560 where the processed audio signals may be redirected to a multi-channel digital audio output port of the audio processor.

Both the serial data input port 540 and output port 560 may use a bit clock signal 571 and/or a frame clock signal 572 from a corresponding serial clock domain 570 to properly time the routing, splitting, and/or merging of audio data relating to different channels. The digital signal processor 550 may use a separate clock signal obtained from the hybrid PLL integrated circuit 515. The hybrid PLL integrated circuit 515 may use a crystal oscillator signal 514 (or an oscillating signal from another source) as a reference signal from which digital signal processor 550 clock signal is generated.

The oscillator signal 514 may be directly coupled to an input pin of the hybrid PLL integrated circuit 515 through a trace on the printed circuit board. The hybrid PLL integrated circuit 515 may have a configuration similar to those shown in FIGS. 1 and/or 2, thereby bypassing the need for additional external passive signal conditioning elements, such as resistors and/or capacitors, to boost the frequency of the oscillating signal before inputting the signal to an analog PLL. These external passive components may be bypassed because the digital PLL may boost the frequency of the crystal oscillator before the signal is input to an analog PLL coupled to the digital PLL.

The output of the analog PLL in the hybrid PLL integrated circuit 515 may then be used a clock signal for the digital signal processor 550 and a clock signal output device 525. The clock signal output device 525 may scale or otherwise modify the output signal from the analog PLL depending on a selected clock mode provided to the clock signal output device through a clock mode input signal 526. The scale or otherwise modified output signal from the analog PLL may then be outputted by the printed circuit board 500 at a clock out port as a clock out signal 527, which may be used by other circuits as desired.

The foregoing description has been presented for purposes of illustration and description. It is not exhaustive and does not limit embodiments of the invention to the precise forms disclosed. Modifications and variations are possible in light of the above teachings or may be acquired from the practicing embodiments consistent with the invention. For example, some of the described embodiments may refer to raising or scaling signals by factors such as Y 402 and X 404. In some embodiments, the factors X and/or Y may be whole numbers, but in others they may be non-whole numbers, such as scaling factors resulting through the use of fractional-n synthesizers. Similarly, different scaler configurations may include different combinations of one or more frequency multipliers, frequency dividers, fractional-n synthesizers, delta-sigma synthesizers, and/or other scaling circuits.

We claim:

1. An integrated circuit, comprising:
   a digital phase locked loop having an input coupled to a pin of the integrated circuit; and
   an analog phase locked loop having an input coupled to an output of the digital phase locked loop; wherein
   the pin is coupled to a clock source without use of passive signal conditioning elements coupled directly to the pin.

2. The integrated circuit of claim 1, wherein the digital phase locked loop has a narrow bandwidth selected to generate a higher frequency output signal having a high-passed jitter from a lower frequency input signal, while rejecting a low frequency jitter.

3. The integrated circuit of claim 2, wherein the analog phase locked loop includes a filter to filter the high-passed jitter in the higher frequency output signal.

4. The integrated circuit of claim 1, wherein a loop bandwidth of the digital phase locked loop is configured to lock to a reference input frequency less than 48 kHz and the digital phase locked loop is configured to generate a higher frequency digital phase locked loop output signal.

5. The integrated circuit of claim 4, wherein a loop bandwidth of the analog phase locked loop higher than that of the digital phase locked loop is selected to filter a jitter associated with the higher frequency digital phase locked loop output signal and the analog phase locked loop is configured to generate an output signal having a higher frequency than that of the digital phase locked loop without use of passive signal conditioning elements.

6. The integrated circuit of claim 1, wherein the digital phase locked loop includes a digital phase detector to detect a phase difference between the reference signal and a scaled output signal of the digital phase locked loop.

7. The integrated circuit of claim 6, wherein the digital phase locked loop includes a numerically controlled oscillator coupled to an output of the digital phase detector to generate the analog phase locked loop input signal, the numerically controlled oscillator clocked from a free running on-chip ring oscillator.

8. The integrated circuit of claim 6, wherein the digital phase locked loop includes a counter and low-pass filter coupled between the digital phase detector and the numerically controlled oscillator.

9. The integrated circuit of claim 6, wherein the free running ring oscillator includes an odd number of inverters coupled together in a chain.

10. The integrated circuit of claim 6, wherein the digital phase locked loop includes a scaler to scale an output of the numerically controlled oscillator to the frequency high enough to maintain analog phase locked loop stability.

11. The integrated circuit of claim 6, wherein the reference signal is at about or between 32 kHz and 49 kHz, the numerically controlled oscillator oscillates at about or between 25 MHz and 60 MHz, and the generated an analog phase locked loop input signal is at about or between 11 MHz and 12 MHz.

12. The integrated circuit of claim 11, wherein the numerically controlled oscillator oscillates at a nominal frequency of 37.5 MHz.

13. The integrated circuit of claim 11, wherein an output of the analog phase locked loop is at about or between 45 MHz and 49 MHz.

14. The integrated circuit of claim 6, wherein the analog phase locked loop include an analog phase detector, a charge pump, a low-pass filter, a voltage controlled oscillator, and a scaler.

15. The integrated circuit of claim 1, wherein the integrated circuit is embedded in a low-power device.

16. The integrated circuit of claim 15, wherein the low-power device is at least one of: a portable computing device, a telephony device, and a media playing device.

17. A method of generating an analog phase locked loop input signal comprising:
  identifying a phase difference between a reference signal and a scaled variation of the reference signal at a digital phase detector, the reference signal having a frequency that is not high enough to maintain analog phase locked loop stability;
  generating the analog phase locked loop input signal at a numerically controlled oscillator based on the identified phase difference, the analog phase locked loop input signal having a frequency high enough to maintain analog phase locked loop stability; and
  scaling the generated analog phase locked loop input signal to generate the scaled variation of the reference signal.

18. The method of claim 17, wherein the numerically controlled oscillator is clocked from a free running ring oscillator.

19. The method of claim 18, wherein the free running ring oscillator includes an odd number of inverters coupled together in a chain.

20. The method of claim 17, wherein the method is executed in a digital phase locked loop coupled to an analog phase locked loop, the generated analog phase locked loop input signal supplied to the analog phase locked loop through the coupling.

21. The method of claim 20, wherein the phase difference is identified through a digital phase detector in the digital phase locked loop.

22. A method of generating an analog phase locked loop input signal comprising:
  carrying a clock signal between a trace on a printed circuit board and an input of a digital phase detector connected to the printed circuit board without conditioning the clock signal through passive signal conditioning elements;
  identifying a phase difference between a clock signal and a scaled variation of the clock signal at the digital phase detector;
  generating the analog phase locked loop input signal at a numerically controlled oscillator based on the identified phase difference; and
  scaling the generated analog phase locked loop input signal to generate the scaled variation of the reference signal.

23. A system, comprising:
  a printed circuit board having a trace for a clock signal, and
  an integrated circuit mounted on the printed circuit board and having a input pin thereof connected to the trace without passive signal conditioning elements coupled to the pin, the integrated circuit comprising:
    a digital phase locked loop having an input coupled to the pin; and
    an analog phase locked loop having an input coupled to an output of the digital phase locked loop.

24. A hybrid digital-analog phase locked loop comprising:
  a digital phase locked loop; and
  an analog phase locked loop; wherein
  a reference signal from an oscillator that is not scaled through a passive signal conditioning element external to oscillator is coupled to an input of the digital phase locked loop and an output of the digital phase locked loop is coupled to an input of the analog phase locked loop.

25. A hybrid digital-analog phase locked loop comprising:
  a digital phase locked loop coupled to a reference signal; and
  an analog phase locked loop coupled to the digital phase locked loop, wherein
  the digital phase locked loop generates an analog phase locked loop input signal having a frequency high enough to maintain analog phase locked loop stability from the reference signal having a lower frequency that is not high enough to maintain analog phase locked loop stability.

26. The system of claim 23, wherein the integrated circuit is used to provide an up-scaled clock signal to an audio processor.

27. The system of claim 26, wherein the audio processor is connected to the printed circuit board.

28. An integrated circuit, comprising:
  a digital phase locked loop having an input coupled to a reference input signal with frequency $\omega_{in}$ and having a loop bandwidth selected to generate a higher frequency output signal $\omega_{out}$; and
  an analog phase locked loop having an input coupled to the higher frequency output signal $\omega_{out}$ of the digital phase locked loop, the analog phase locked loop having a resistance $R_c$, a capacitance $C_c$, a normalized loop gain K, and a time constant of a loop filter zero $\tau_z$, wherein $$\frac{1}{\frac{\pi}{\omega_{out}\tau_z}\left(1+\frac{\pi}{\omega_{out}\tau_z}\right)} > K\tau_z \geq \frac{1}{\frac{\pi}{\omega_{in}\tau_z}\left(1+\frac{\pi}{\omega_{in}\tau_z}\right)}.$$

* * * * *

UNITED STATES PATENT AND TRADEMARK OFFICE
CERTIFICATE OF CORRECTION

| | | |
|---|---|---|
| PATENT NO. | : 8,461,885 B2 | Page 1 of 1 |
| APPLICATION NO. | : 13/155561 | |
| DATED | : June 11, 2013 | |
| INVENTOR(S) | : Nguyen et al. | |

It is certified that error appears in the above-identified patent and that said Letters Patent is hereby corrected as shown below:

In the Claims:

Column 7, line 6, please change:

"and the generated an analog" to --and the generated analog--

Signed and Sealed this
Thirteenth Day of August, 2013

Teresa Stanek Rea
*Acting Director of the United States Patent and Trademark Office*